United States Patent
Lobbins

(10) Patent No.: US 6,506,690 B1
(45) Date of Patent: Jan. 14, 2003

(54) METHOD FOR FORMING DIELECTRIC STACK INCLUDING SECOND DIELECTRIC LAYER WITH LOWER UNDOPED PORTION AND UPPER DOPED PORTION

(75) Inventor: Jonathon M. Lobbins, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/557,430

(22) Filed: Apr. 25, 2000

(51) Int. Cl.[7] ................... H01L 21/31; H01L 21/469
(52) U.S. Cl. ............... 438/783; 438/624; 438/761; 438/763; 438/778; 438/784
(58) Field of Search .................. 438/624, 761, 438/763, 778, 783, 784, 762, 787, 788; 427/519, 255.37

(56) References Cited

U.S. PATENT DOCUMENTS

| | | | |
|---|---|---|---|
| 5,041,397 A | * 8/1991 | Kim et al. ................ 438/784 |
| 5,173,449 A | * 12/1992 | Lorenzen et al. ........... 438/653 |
| 5,716,890 A | * 2/1998 | Yao ..................... 438/624 |
| 5,937,323 A | * 8/1999 | Orczyk et al. ............. 438/624 |
| 6,153,512 A | * 11/2000 | Chang et al. .............. 438/624 |
| 6,153,537 A | * 11/2000 | Bacchetta et al. .......... 438/763 |
| 6,165,915 A | * 12/2000 | Jang ..................... 438/787 |

OTHER PUBLICATIONS

Wolf, S., Silicon Processing for the VLSI Era, 1990, Lattice Press, vol. 2: Process Integration, p. 196.*

* cited by examiner

Primary Examiner—Matthew Smith
Assistant Examiner—Craig P. Lytle

(57) ABSTRACT

An intermediary dielectric layer is disposed between two dielectric layers thereby eliminating a flow stabilization step that may produce unwanted deposition that leads to peeling. A wafer is provided having an HDP layer. An undoped silicon glass layer is deposited on top of the HDP layer to improve adherence of a subsequently deposited PSG layer.

42 Claims, 2 Drawing Sheets

METHOD FOR FORMING DIELECTRIC STACK INCLUDING SECOND DIELECTRIC LAYER WITH LOWER UNDOPED PORTION AND UPPER DOPED PORTION

TECHNICAL FIELD OF THE INVENTION

This invention relates to dielectric layer formation, such as that used for fabricating semiconductor devices.

BACKGROUND OF THE INVENTION

Semiconductor devices comprise layers of materials such as dielectrics and metals. Continued adherence of adjacent layers is important for device reliability and performance. If stress is present at layer interfaces peeling may occur during manufacturing processes or device utilization. For example, in the manufacture of semiconductor devices, high density plasma oxide (HDP) may be deposited on phosphosilicate glass (PSG). Subsequent etching of the layers sometimes results in the HDP peeling from the PSG, particularly in areas having a high density of windows and lines.

The SEM wafer cross-section in FIG. 1 shows a partially manufactured semiconductor device exhibiting peeling at a PSG/HDP interface. Prior to deposition of the PSG on the HDP layer, a flow stabilization step was performed. Tetraethylorthosilicate (TEOS), $O_2$ and He were stabilized in the presence of a triethylphosphate (TEPO) flow. TEPO was used as a doping source in the subsequent PSG deposition step. A window was then etched through the PSG layer and into the HDP layer. Ti/TiN was deposited on the PSG surface and within the window. The wafer underwent a hydrofluoric acid etch in a 100:1 solution of $H_2O$ to HF. Location A on FIG. 1 shows a separation or peeling of the PSG layer from the HDP layer. It can be seen in FIG. 1 at location B that a lip has formed between the two layers. This lip formation provides a weak area that may be more prone to etchant attack in subsequent etching processes and thus facilitates peeling.

The PSG peeling from the HDP layer is likely to occur when phosphorus doping source TEPO deposits thermally during the flow stabilization step prior to PSG deposition. The purpose of the flow stabilization step is to allow the flow meter, which regulates the phosphorous flow, to stabilize prior to the deposition step. During flow stabilization phosphorous flow may go beyond or fall below an optimum amount. When the phosphorous overshoots the optimum concentration, i.e. when a flow spike occurs, an unintended thermally deposited layer is generated which contains phosphorus concentrations of about 20 to 30 weight percent. This highly concentrated phosphorus-containing layer etches faster than the intended phosphorus-containing layer which may lead to peeling. Furthermore, the space between the HDP and PSG layers created by the peeling may disadvantageously fill with subsequently deposited layers such as tungsten which may lead to device failure.

Attempts to remedy the peeling process include pumping TEPO out of the deposition system through a bypass valve normally present within the deposition apparatus, to eliminate unwanted thermally-deposited phosphorus during the flow stabilization step. However, when utilized in this manner, the bypass valve is prone to clogging and failure. When the bypass valve fails, the concentration of TEPO in the deposition chamber may cause thermal deposition, and hence peeling.

Therefore, it is desirable to have a process wherein unwanted thermally deposited material is reduced or eliminated without adverse effects to process equipment.

SUMMARY OF THE INVENTION

Peeling of a PSG layer from an HDP layer has been substantially eliminated by introducing an undoped dielectric layer between the PSG and HDP layers. By doing so, a flow stabilization process step implemented in conventional methods prior to PSG deposition may be eliminated. Further eliminated is bypass valve usage to pump TEPO from the deposition chamber, thereby avoiding problems associated with bypass valve failure.

In one embodiment a wafer is provided having an HDP layer. An undoped silicon glass layer is deposited on top of the HDP layer which improves adherence of a subsequently deposited PSG layer. A further embodiment includes creating a substantial vacuum in a deposition chamber after deposition of the PSG layer and thereafter filling the chamber with an inert gas. The inert gas purges the deposition chamber of residual gases. A vacuum is again drawn in the deposition chamber to substantially remove the inert gas.

Embodiments of the invention may be applied to dielectric layers other than PSG and HDP that exhibit peeling or other interface weaknesses when disposed upon one another. An intermediary dielectric layer is disposed between two dielectric layers thereby eliminating a flow stabilization step that may produce unwanted deposition that leads to peeling.

DETAILED DESCRIPTION OF THE INVENTION

The invention provides improved adhesion of dielectric layers. Advantageously weak areas such as lips formed at dielectric layer interfaces, are significantly reduced, thereby substantially eliminating peeling. Embodiments of the invention are particularly applicable to an undoped first dielectric layer having a doped second dielectric layer formed thereon. The second layer comprises a substantially undoped lower portion and a doped upper portion. The second layer lower portion is formed in lieu of a conventional flow stabilization step. By omitting the conventional flow stabilization step prior to a dielectric layer being deposited on another dielectric layer, an unintended thermally deposited layer that typically promotes dielectric layer peeling is substantially reduced or eliminated. Additionally, the technique does not require use of a bypass valve to pump out doping sources such as TEPO, or the like, that may contribute to unwanted thermally deposited substances such as phosphorus rich material, thus eliminating bypass valve clogging problems.

As an example, a conventional method may include a flow stabilization step wherein flows of helium, silicon oxide deposition source TEOS and phosphorus dopant source TEPO are present. These gases are utilized in the deposition of a phosphosilicate glass layer on an underlying undoped dielectric layer. In a method according to embodiments of the invention, the flow stabilization step is replaced by a deposition step wherein TEOS and helium flow without TEPO present to form an undoped silicate glass. Phosphorus doping source TEPO is then introduced to continue the layer formation in a phosphorus-doped form.

Advantageously, it is believed that plasma damage that often occurs during plasma enhanced chemical vapor deposition, may be reduced by methods of the invention. The second layer lower portion may protect the underlying first dielectric layer from the damage inflicted at the onset of deposition.

Embodiments of the invention are particularly applicable to PSG interfaced with HDP in semiconductor devices. An unwanted thermally deposited layer comprising concentrations of phosphorus higher than the PSG is substantially eliminated. The absence of this layer renders areas exposed to subsequent etching more uniform in phosphorus content, and therefore, more evenly etched. More uniform etching substantially eliminates areas such as lips at the dielectric layer interface that may lead to peeling.

Figure 1:
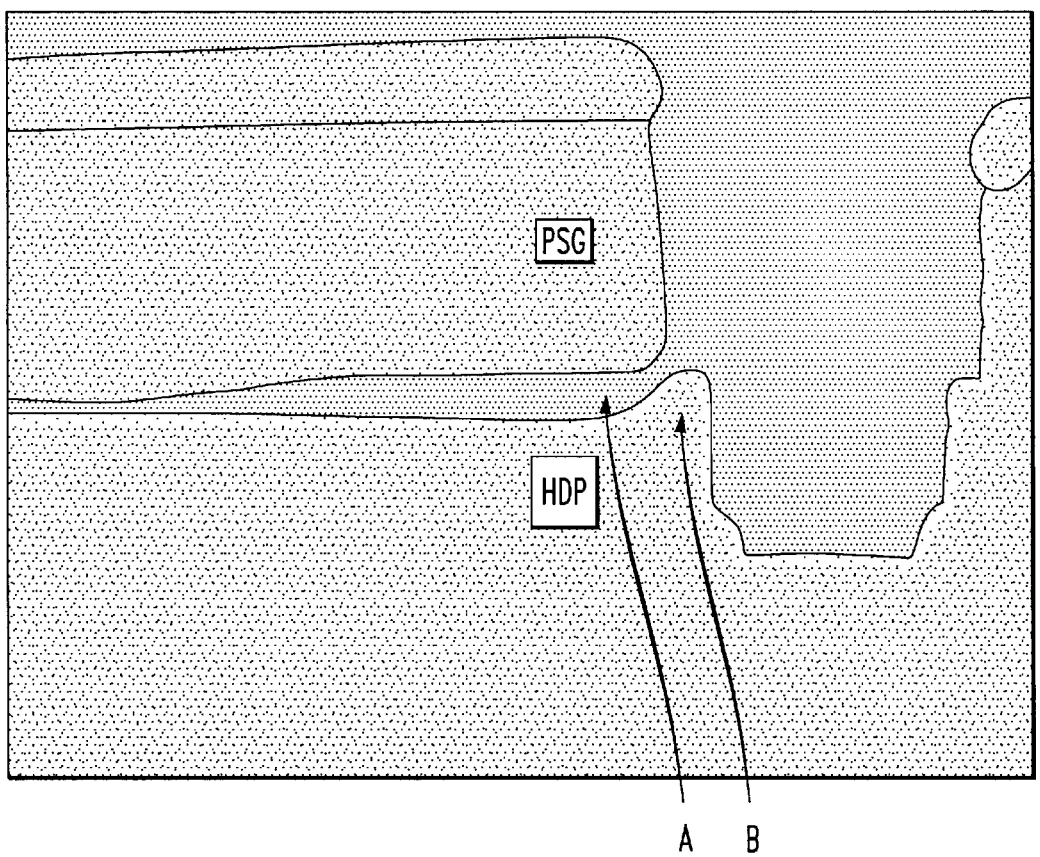
FIG. 1 is an SEM wafer cross-section of PSG and HDP layers.
Figure 2:
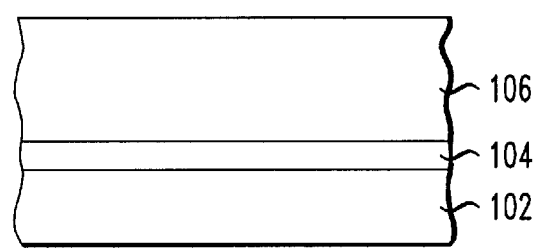
FIG. 2 depicts a portion of a semiconductor device according to one embodiment of the invention.

FIG. 2 depicts a stack of dielectric materials. A first dielectric layer 102 is provided, upon which a second dielectric layer lower portion 104 is formed. A second dielectric layer upper portion 106 is then formed on lower portion 104. In one embodiment of the invention first dielectric layer 102 is undoped and the second dielectric layer is doped only in upper portion 106. Undoped lower portion 104 improves adherence of subsequently deposited upper portion 106 as compared to upper portion 106 being formed directly on first dielectric layer 102. Lower portion 104 and upper portion 106 together form a dielectric layer that may have a continuous gradient of dopant from substantially no concentration in lower portion 104 to a maximum concentration in upper portion 106. "Continuous gradient" as used herein may include a linear or curved gradient. Preferably the gradient includes substantially zero dopant concentration in lower portion 104, a continually increasing concentration beginning at the upper portion/lower portion interface and continuing through less than about the first 5% of upper portion 106 as measured from the interface, and leveling off to a maximum concentration thereafter. Preferably about 99% of upper portion 106 has a maximum dopant concentration wherein the remaining 1% is that which is adjacent to the upper portion/lower portion interface.

After deposition of upper portion 106 a vacuum may be created in the deposition chamber to remove unwanted residual substances. The chamber may then be substantially filled with an inert gas to flush out remaining unwanted material. To remove the inert gas a substantial vacuum may again be pulled in the deposition chamber.

The second dielectric layer upper and lower portion depositions may be performed by any deposition method compatible with the type of dielectric material used and the application of the workpiece. For example, the deposition method may be selected from the group comprising low pressure chemical vapor deposition, plasma enhanced chemical vapor deposition and atmospheric-pressure chemical vapor deposition. Preferably layers 102, 104 and 106 are deposited by plasma enhanced vapor deposition. The second dielectric layer comprising upper and lower portions 104 and 106 may be continuously deposited or may be deposited in separate steps.

Preferably depositions of second layer upper and lower portions 104 and 106 are performed at the same temperature. For many deposition methods, including those listed above, the temperature is preferably in the range of about 420° C. to about 540° C., and more preferably in the range of about 470° C. to about 490° C. The optimum deposition temperature depends in part on the deposition pressure. Preferably the deposition pressure is in the range of about 8 torr to about 16 torr, and more preferably in the range of about 13 torr to about 15 torr. For an HDP layer having an undoped silicate glass layer disposed thereon and a PSG layer disposed on the undoped silicate glass, the deposition temperature is preferably about 480° C. and the pressure is preferably 14 torr.

First dielectric layer 102 may have any thickness suitable for its application. For some applications, for example semiconductor device fabrication, first dielectric layer 102 thickness is preferably in the range of about 500 Å to about 3500 Å, and more preferably in the range of about 1500 Å to about 2500 Å and most preferably about 2000 Å.

Any second layer lower portion thickness is suitable that improves adherence of the layer without significantly negatively affecting properties or performance of the product in which it is contained or significantly adversely affecting other fabrication processes. For many applications, such as semiconductor device fabrication, second layer lower portion 104 thickness is preferably in the range of about 50 Å to about 1500 Å, more preferably in the range of about 100 Å to about 500 Å, and most preferably in the range of about 200 Å to about 400 Å.

The thickness of second layer upper portion 106 may be any thickness suitable for its application. For some applications, for example semiconductor device fabrication, upper portion 106 thickness is preferably in the range of about 8,000 Å to about 20,000 Å, and more preferably in the range of about 12,000 Å to about 16,000 Å and most preferably about 14,000 Å.

In one embodiment of the invention second layer lower portion 104 is selected from the group consisting of undoped silicate glass, silicon oxynitride and silicon nitride and is preferably undoped silicate glass. In another embodiment of the invention second layer upper portion 106 is selected from the group consisting of phosphosilicate glass and fluorosilicate glass and is preferably phosphosilicate glass.

In one embodiment of the invention first dielectric layer 102 is selected from the group consisting of high density plasma oxide, thermal oxide, nitride and oxynitride wherein the preferred first dielectric is high density plasma oxide. First dielectric layer 102 may have gap-filling properties to fill spaces existing on the layer on which it is formed. For example, polysilicon or metal features having spaces therebetween may exist on the layer underlying layer 102. A desired subsequent layer such as silicate glass may not have a density sufficient to fill the gaps. Therefore, a layer having gap-filling properties such as high density plasma oxide may be utilized prior to the formation of the desired layer.

In one embodiment of the invention first dielectric 102 is a high density plasma oxide, second layer lower portion 104 is undoped silicate glass, and second layer upper portion 106 is phosphosilicate glass.

One or more of the dielectric layers, or portions thereof, may be densified to improve layer adherence to one another. Typically the lower the temperature at which a layer is deposited the lower its density. Silicon dioxide layers, for example, generally have lower densities when deposited at temperatures below about 500° C. than layers deposited at higher temperatures. Heating deposited dielectric layers typically causes densification. For example, heating an amorphous silicon dioxide layer at temperatures between about 600° C. and about 1000° C. decreases the oxide thickness while maintaining the mass, thereby causing densification. It has been found that adherence between dielectric layers is improved when at least one of the layers is densified. Densified deposited silicon dioxide typically takes on characteristics of thermally grown oxides. Thus, densification is most affective for deposited oxides.

Figure 3:
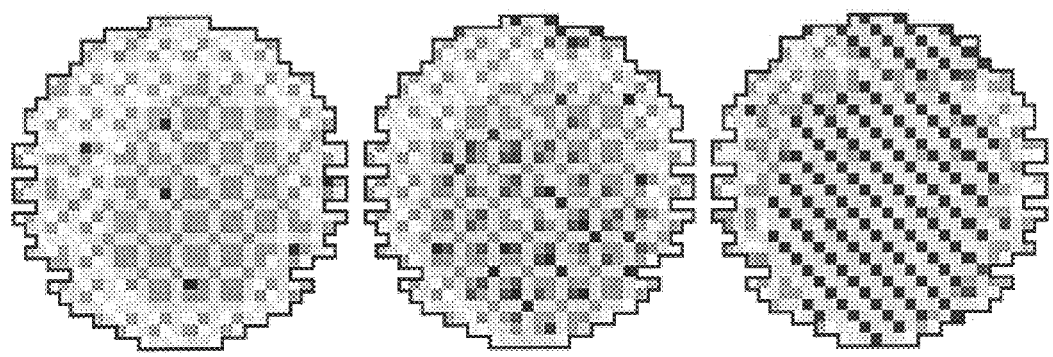
FIG. 3 depicts an SEC split yield image for semiconductor chips fabricated using conventional methods.
Figure 4:
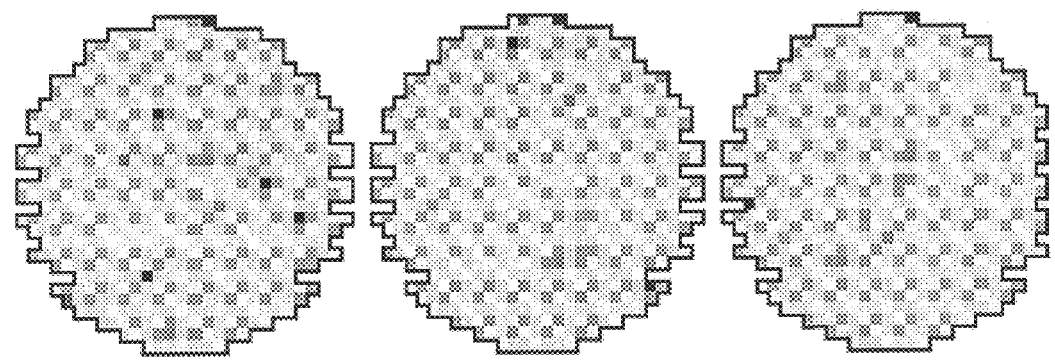
FIG. 4 depicts an SEC split yield image for semiconductor chips fabricated using embodiments of the invention.

A further embodiment of the invention includes a semiconductor device wherein at least a portion of the device is fabricated by methods provided herein. Experiments have shown that semiconductor device product yield is significantly increased by use of an intermediary dielectric such as dielectric layer portion 104. FIG. 3 depicts an SEC image of a wafer having a plurality of chips that were fabricated using deposition methods with flow stabilization steps performed during layering of phosphosilicate glass on high density plasma oxide. Dark dense areas correspond to yield failures which comprise approximately 64% of the chips per wafer. FIG. 4 depicts an SEC image of a wafer having a plurality of chips wherein undoped silicate glass is disposed between phosphosilicate glass and high density plasma oxide. Dark areas correspond to yield failures and comprise only about 8% of the chips per wafer evidencing a drastic improvement in yield.

Additional experiments were performed comparing conventional processes using a bypass valve to pump TEPO out of the deposition system to reduce resulting thermal deposition, with embodiments of the invention wherein neither a flow stabilization step nor a bypass valve was utilized. Failure rates were similar in both processes until the bypass valve became inoperative due to clogging, at which time the yield dropped by approximately 46%. Thus, embodiments of the invention provide greatly improved product yield by elimination of the flow stabilization step and significantly improved yield reliability by elimination of the bypass valve and its associated failure risk.

While the invention has been described in what is presently considered to be preferred embodiments, many variations and modifications will become apparent to those skilled in the art. Accordingly, it is intended that the invention not be limited to the specific illustrative embodiments but be interpreted within the full spirit and scope of the appended claims.

What is claimed is:

1. A method for forming dielectric material over the surface of a semiconductor layer comprising semiconductor device components, the method comprising:

providing an undoped first dielectric layer over the surface by high density plasma deposition; and depositing a second dielectric layer over the first dielectric layer by first forming a lower portion of the second layer with an undoped dielectric material and then forming an upper portion of the second layer with a doped dielelectric material.

2. The method of claim 1 wherein the resulting deposition provides a substantially continuous gradient of dopant from substantially no concentration in the lower portion of the second layer to a maximum concentration in the upper portion of the second layer.

3. The method of claim 1 further comprising depositing and providing the second layer lower portion at a temperature in the range of about 420° C. to about 540° C.

4. The method of claim 1 further comprising:

after deposition of the upper portion of the second layer, creating a substantial vacuum in a deposition chamber;

substantially filling the deposition chamber with an inert gas; and creating a substantial vacuum in the deposition chamber.

5. The method of claim 1 further comprising providing the first dielectric layer to a thickness in the range of about 500 Å to about 3500 Å.

6. The method of claim 1 further comprising providing the first dielectric layer to a thickness in the range of about 1500 Å to about 2500 Å.

7. The method of claim 1 further comprising depositing the second layer lower portion to a thickness in the range of about 50 Å to about 1500 Å.

8. The method of claim 1 further comprising depositing the second layer lower portion to a thickness in the range of about 100 Å to about 500 Å.

9. The method of claim 1 further comprising depositing the second layer lower portion to thickness in the range of about 200 Å to about 400 Å.

10. The method of claim 1 carried out under a pressure in the range of about 8 torr to about 16 torr.

11. The method of claim 1 carried out under a pressure in the range of about 13 torr to about 15 torr.

12. The method of claim 1 wherein deposition of the second layer is performed by a process selected from the group consisting of low pressure chemical vapor deposition, plasma enhanced chemical vapor deposition and atmospheric-pressure chemical vapor deposition.

13. The method of claim 1 wherein the second layer lower portion is selected from the group consisting of undoped silicate glass, silicon oxynitride and silicon nitride.

14. The method of claim 1 wherein the second layer upper portion is selected from the group consisting of phosphosilicate glass and fluorosilicate glass.

15. The method of claim 1 wherein the first dielectric is selected from the group consisting of high density plasma oxide, thermal oxide, nitride and oxynitride.

16. The method of claim 1 wherein the first dielectric is a high density plasma oxide, the second layer lower portion is an undoped silicate glass, and the second layer upper portion is a phosphosilicate glass.

17. The method of claim 1 further comprising densifying at least a portion of at least one dielectric layer.

18. The method of claim 17 further comprising densifying at a temperature in the range of about 600° C. to about 1000° C.

19. The method of claim 1 further comprising depositing the second layer upper portion to a thickness in the range of about 8000 Å to about 20,000 Å.

20. The method of claim 1 further comprising depositing the second layer upper portion to a thickness in the range of about 12,000 Å to about 16,000 Å.

21. The method of claim 1 wherein the first dielectric layer has gap-filling properties.

22. A semiconductor device manufactured in accordance with claim 1.

23. A semiconductor device comprising:

a first undoped dielectric layer formed by high density plasma deposition; and a second dielectirc layer disposed on the first dielectric layer, the second dielectric layer having a doped upper portion and an undoped lower portion wherein the lower portion is disposed between the first dielectric layer and the upper portion.

24. The device of claim 23 wherein a substantially continuous gradient of dopant exists from substantially no concentration in the lower portion to a maximum concentration in the upper portion.

25. The device of claim 23 wherein the first dielectric layer has a thickness in the range of about 500 Å to about 3500 Å.

26. The device of claim 23 wherein the first dielectric layer has a thickness in the range of about 1500 Å to about 2500 Å.

27. The device of claim 23 wherein the second layer lower portion has a thickness in the range of about 50 Å to about 1500 Å.

28. The device of claim 23 wherein the second layer lower portion has a thickness in the range of about 100 Å to about 500 Å.

29. The device of claim 23 wherein the second layer lower portion has a thickness in the range of about 200 Å to about 400 Å.

30. The device of claim 23 wherein the second layer lower portion is selected from the group consisting of undoped silicate glass, silicon oxynitride and silicon nitride.

31. The device of claim 23 wherein the second layer upper portion is selected from the group consisting of phosphosilicate glass and fluorosilicate glass.

32. The device of claim 23 wherein the first dielectric is selected from the group consisting of high density plasma oxide, thermal oxide, nitride and oxynitride.

33. The device of claim 23 wherein the first dielectric is a high density plasma oxide, the second layer lower portion is an undoped silicate glass, and the second layer upper portion is a phosphosilicate glass.

34. The device of claim 23 further comprising densifying at least a portion of at least one dielectric layer.

35. The device of claim 23 wherein the second layer upper portion has a thickness in the range of about 8000 Å to about 20,000 Å.

36. The device of claim 23 wherein the second layer upper portion has a thickness in the range of about 12,000 Å to about 16,000 Å.

37. The device of claim 23 wherein the first undoped dielectric layer has gap-filling properties.

38. A method for forming dielectric material over the surface of a semiconductor layer comprising semiconductor device components, the method comprising:

providing an undoped first dielectric layer having gap-fill properties over the surface;

continuously depositing a second dielectric layer over the first dielectric layer by first forming a lower portion of the second layer with undoped silicate glass and then forming an upper portion of the second layer with doped silicate glass, wherein the resulting deposition provides a substantially continuous gradient of dopant from substantially no dopant concentration in the second layer lower portion to a maximum dopant concentration in the second layer upper portion.

39. A semiconductor device fabricated in accordance with claim 38.

40. A method for forming dielectric material over the surface of a semiconductor layer comprising semiconductor device components, the method comprising:

providing an undoped high density plasma oxide layer over the surface to a thickness in the range of about 500 Å to about 3500 Å;

forming a silicate glass layer over the high density plasma oxide layer by first forming an undoped silicate glass layer lower portion to a thickness in the range of about 50 Å to about 1500 Å and then forming a phosphosilicate glass layer upper portion to a thickness of about 8000 to about 20,000 Å, wherein the resulting deposition provides a substantially continuous gradient of phosphorus from substantially no phosphorus concentration in the silicate glass layer lower portion to a maximum phosphorus concentration in the silicate glass layer upper portion.

41. A semiconductor device fabricated in accordance with claim 40.

42. A method for forming dielectric material over the surface of a semiconductor layer comprising semiconductor device components, the method comprising:

providing a first dielectric layer over the surface;

depositing a second dielectric layer over the first dielectric layer by first forming a lower portion of the second layer with an undoped dielectric material and then forming an upper portion of the second layer with a doped dielectric material; and wherein formation of the second layer lower portion substantially eliminates a need for a flow stabilization step.

* * * * *